United States Patent
Zhou et al.

(10) Patent No.: US 7,212,060 B1
(45) Date of Patent: May 1, 2007

(54) GROUND BOUNCE PROTECTION CIRCUIT FOR A TEST MODE PIN

(75) Inventors: Shi-dong Zhou, Milpitas, CA (US); Gubo Huang, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 46 days.

(21) Appl. No.: 11/210,136

(22) Filed: Aug. 23, 2005

(51) Int. Cl.
*H03K 17/16* (2006.01)

(52) U.S. Cl. .................. 327/379; 326/16; 326/83; 327/408; 327/427

(58) Field of Classification Search ............... 326/16, 326/38, 83; 327/108, 112, 379, 408, 409, 327/427
See application file for complete search history.

(56) References Cited

U.S. PATENT DOCUMENTS

| | | | |
|---|---|---|---|
| 4,574,273 A | 3/1986 | Atsumi et al. | |
| 4,926,070 A | 5/1990 | Tanaka et al. | |
| 5,136,191 A | 8/1992 | Nunogami | |
| 5,151,616 A | 9/1992 | Komuro | |
| 5,416,368 A | 5/1995 | Sugibayashi | |
| 5,534,795 A | 7/1996 | Wert et al. | |
| 5,644,265 A | 7/1997 | Austin et al. | |
| 5,650,742 A | 7/1997 | Hirano | |
| 5,894,230 A | 4/1999 | Voldman | |
| 6,052,321 A * | 4/2000 | Roohparvar | 365/201 |
| 6,147,540 A | 11/2000 | Coddington | |
| 6,335,636 B1 * | 1/2002 | Yeung et al. | 326/41 |
| 6,359,493 B2 | 3/2002 | Satomi | |
| 6,822,475 B2 * | 11/2004 | Loughmiller | 326/16 |

* cited by examiner

*Primary Examiner*—Jeffrey Zweizig
(74) *Attorney, Agent, or Firm*—William L. Paradice, III; Lois D. Cartier

(57) ABSTRACT

A test-mode circuit allows the same pad of a semiconductor device to be used as a test pad during test operations and as an I/O pad during normal operations. The test-mode circuit is coupled between the pad and a reference signal (Vbg) of the device, and in response to a control signal (CTRL1) either couples the pad and the reference signal (Vbg) together or isolates the pad and the reference signal (Vbg) from each other. The test-mode circuit includes at least one NMOS transistor (MN1) and a PMOS transistor (MP1) connected in series between the pad and the reference signal (Vbg). During normal operation, the NMOS transistor (MN1) isolates the reference signal (Vbg) from the pad, and the PMOS transistor (MP1) compensates for voltage undershoot conditions at the pad.

17 Claims, 5 Drawing Sheets

GROUND BOUNCE PROTECTION CIRCUIT FOR A TEST MODE PIN

FIELD OF INVENTION

The present invention relates generally to integrated circuits, and more specifically to reducing the susceptibility of a reference signal to undesirable fluctuations caused by switching events at an input/output pad of the circuit.

DESCRIPTION OF RELATED ART

A configurable integrated circuit (IC) is an integrated circuit including various configurable resources. A programmable logic device (PLD) is a well-known type of configurable IC that can be programmed by a user to implement a variety of selected functions. PLDs are becoming increasingly popular with circuit designers because they require less time to design than custom-designed integrated circuits such as Application Specific Integrated Circuits (ASICs).

Many PLD's include one or more "test-mode" pads that allow test engineers to observe and test various important system signals internal to the PLD. For example, during pre-packaging test operations of a PLD, a test engineer may use the PLD's test-mode pad to observe the value of the bandgap reference voltage (Vbg) generated for the PLD. Because Vbg is used for many logic functions (e.g., as a reference voltage for logic compare operations), the value of Vbg must be precise to ensure proper operation of the circuit. If the value of Vbg is not within an acceptable range or undesirably fluctuates during normal operation, the circuit may not operate properly.

For many PLD designs, the same pad is used as a test-mode pad during pre-packaging test operations and as an input/output (I/O) pad during normal operations to minimize the number of pads. Thus, such pads are typically coupled to both the device's internal circuitry (e.g., circuitry that generates Vbg) and to the device's I/O circuitry. For example, FIG. 1 shows an integrated circuit 100 such as a PLD that includes a pad 102, an input buffer 110, an output buffer 120, a test-mode circuit 130, a logic core 140, and a bandgap reference voltage circuit 150. For simplicity, only one pad 102, associated buffers 110–120, and test-mode circuit 130 are shown in FIG. 1. Logic core 140 may include any suitable circuitry (e.g., configurable logic elements of a PLD). Bandgap reference voltage circuit 150, which is well-known, generates a bandgap reference voltage (Vbg) for circuit 100. For purposes of discussion herein, circuit 100 utilizes a supply voltage VDD of 2.5 volts, and bandgap reference voltage circuit 150 generates a value for Vbg of approximately 1.2 volts. Input buffer 110, which is well-known, is coupled to pad 102 and buffers input signals IN_core received from pad 102 for input to logic core 140. Output buffer 120, which is well-known, is coupled to logic core 140 and buffers output signals OUT_core received from logic core 140 for output to pad 102. For example, output circuit 120 includes PMOS transistors 121–122 and NMOS transistors 125–126 connected in series between VDD and ground potential. The gate of transistor 126 receives an enable signal EN. The gate of transistor 121 receives the complement of EN, which is denotes as EN_b. The commonly-coupled gates of transistors 122 and 125 form an inverter input to receive OUT_core from logic core 140. The commonly-coupled drains of transistors 122 and 125 form an inverter output that is coupled to pad 102. As known in the art, assertion of EN (e.g., to logic high) turns on transistors 121 and 126 to enable output buffer 120, and de-assertion of EN (e.g., to logic low) turns off transistors 121 and 126 to disable output buffer 120.

Test-mode circuit 130, which is well-known, isolates bandgap reference voltage circuit 150 from pad 102 during normal operation of circuit 100. Test circuit 130 includes NMOS transistors MN0 and MN1. Transistor MN1, which is a pass transistor coupled between pad 102 and reference circuit 150, has a gate to receive a control signal CTRL1. Transistor MN0, which is coupled between ground potential and the gate of transistor MN1, is depicted as having a gate coupled to VDD. For purposes of discussion herein, transistor MN0 models the well-known level shifter 200 of FIG. 2 when level shifter 200 drives CTRL1 low to ground potential. For example, referring also to FIG. 2, level shifter 200 includes PMOS transistors 201–202, NMOS transistors 203–204, and an inverter 205. Transistor pairs 201/203 and 202/204 are connected in series between a high voltage rail VPP and ground potential, and inverter 205 is a well-known CMOS inverter having power terminals coupled to VDD and to ground potential. Transistors 201–204 are typically high voltage transistors having thick gate oxides that allow transistors 201–204 to tolerate the high voltages of VPP, while the transistors (not shown for simplicity) that form inverter 205 are typically low voltage transistors having thin gate oxides that allow inverter 205 to have a low threshold voltage.

Level shifter 200 translates a low voltage input control signal CTRL0 to a high voltage output control signal CTRL1 as follows. When CTRL0 is logic low (e.g., CTR0=0 volts), inverter 205 pulls the gate of NMOS transistor 204 high to VDD. In response thereto, transistor 204 turns on and pulls CTRL1 low to ground potential (e.g., CTRL1=0 volts). Conversely, when CTRL0 is logic high (e.g., CTRL0=VDD), NMOS transistor 203 turns on and pulls the gate of PMOS transistor 202 low to ground potential. In response thereto, PMOS transistor 202 turns on and pulls CTRL1 high to VPP (e.g., CTRL1=VPP). In this manner, level shifter 200 can translate a low voltage signal CTRL0 having a voltage swing between 0 volts and VDD to a high voltage signal CTRL1 having a voltage swing between 0 volts and VPP. Typically, the input control signal CTRL0 is stored in a storage element such as a fuse provided in circuit 100, although other suitable memory elements may be used.

Referring also to FIG. 1, CTRL0 is initially set to a logic high state (e.g., by an un-programmed control fuse) to allow the value of Vbg to be observed at pad 102. For example, during a pre-packaging test operation, the logic high level of CTRL0 causes level shifter 200 to drive CTRL1 high to approximately VPP. The logic high state of CTRL1 turns on pass transistor MN1, thereby coupling Vbg to pad 102. Note that because the gate of MN1 is greater than VDD (e.g., >2.5 volts) and the drain of MN1 is equal to Vbg (e.g., 1.2 volts), there is not a threshold voltage drop (VT) across pass transistor MN1, and thus the voltage on pad 102 should be 1.2 volts.

Prior to delivering circuit 100 to a customer, CTRL0 is set to a logic low state (e.g., by programming the control fuse), which causes level shifter 200 to pull CTRL1 low to ground potential, for example, as modeled by transistor MN0 of FIG. 1. The logic low state of CTRL1 turns off pass transistor MN1, thereby isolating Vbg from pad 102. Thereafter, during normal operation, pass transistor MN1 is turned off and isolates pad 102 from Vbg, thereby not only protecting Vbg from signals at pad 102 and but also preventing a customer from observing Vbg via pad 102.

Unfortunately, using the same pad as a test-mode pad for pre-packaging test operations and as an I/O pad for normal operations may render Vbg susceptible to undesirable fluctuations during normal operation of circuit 100. More specifically, during switching events (e.g., logic state transitions of I/O signals) at pads 102, parasitic capacitances, inductances, and resistances associated with circuit 100's package (not shown for simplicity) may result in voltage overshoot and/or undershoot of signals at pad 102. For example, during logic high-to-low signal transitions at pad 102, the pad voltage may fall to a negative voltage of −VT or more, which may undesirably turn on pass transistor MN1 and couple pad 102 to Vbg. Coupling Vbg to pad 102 via transistor MN1 during normal operations may interfere with the voltage levels of signals at pad 102, and/or may undesirably pull Vbg to a negative voltage. For example, FIG. 3 depicts an exemplary simulation of test-mode circuit 130 in which Vbg quickly falls from its specified value of 1.2 volts to less than −0.5 volts in response to voltage undershoot during a logic high-to-low signal transition at pad 102. This negative voltage spike in Vbg, which slowly increases to its specified value after the switching event at pad 102, is undesirable and, as mentioned above, may cause circuit 100 to operate improperly.

In addition, ground bounce caused by switching events at pad 102 may result in a voltage differential between ground potential values for pad 102 and for test-mode circuit 130, which may exacerbate the undesirable fluctuations in Vbg caused by such switching events.

Thus, it is desirable for an IC device to include a test-mode circuit that provides improved protection for an internal signal such as a bandgap reference voltage from undesirable fluctuations caused by switching events at the device's I/O pads.

SUMMARY

A circuit is disclosed that allows the same pad to be used as a test pad for observing internal signals during test operations of an IC device and as an I/O pad during normal operation of the device while reducing the internal signals' susceptibility to undesirable fluctuations caused by switching events at the pad during normal operation. In accordance with the present invention, an IC device includes a reference circuit for generating a reference signal, a pad, and a test-mode circuit. The test-mode circuit, which is coupled between the pad and the reference circuit and is responsive to a control signal, is configured to selectively couple the pad and the reference circuit together during test operations and to isolate the pad and the reference circuit from each other during normal operations. For some embodiments, the control signal may be stored in a suitable storage element provided within the IC device. For one embodiment, level shifters may be used to level shift the control signal(s) provided to the test-mode circuit.

For some embodiments, the test-mode circuit includes first and second NMOS transistors and a PMOS transistor. The first NMOS transistor is coupled between the pad and a first node, and has a gate to receive the control signal. The PMOS transistor is coupled between the first node and a second node, and has a gate tied to ground potential. The second NMOS transistor is coupled between the second node and the reference circuit, and has a gate to receive the control signal. When the control signal is asserted (e.g., during test operations), the NMOS transistors and the PMOS transistors turn on and couple the pad to the reference circuit, thereby allowing a reference signal such as a bandgap reference voltage to be observed at the pad. When the control signal is de-asserted (e.g., during normal operations), the NMOS transistors turn off to isolate the pad and the reference circuit from each other, thereby protecting the reference signal from undesirable fluctuations caused by switching events at the pad. The PMOS transistor compensates for voltage undershoot conditions at the pad and for associated ground bounce by turning off under conditions that may inadvertently turn on the first NMOS transistor.

For other embodiments, the test-mode circuit includes an NMOS transistor and a PMOS transistor. The NMOS transistor is coupled between the pad and a first node, and has a gate to receive the control signal. The PMOS transistor is coupled between the first node and the reference circuit, and has a gate to receive the control signal. When the control signal is asserted (e.g., during test operations), the NMOS and PMOS transistors turn on and couple the pad to the reference circuit, thereby allowing a reference signal such as a bandgap reference voltage to be observed at the pad. When the control signal is de-asserted (e.g., during normal operations), the NMOS and PMOS transistors turn off to isolate the pad and the reference circuit from each other, thereby protecting the reference signal from undesirable fluctuations caused by switching events at the pad.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

The present invention is applicable to a variety of integrated circuits and systems. The present invention has been found to be particularly applicable and beneficial for preventing ground bounce incurred during normal operation of an integrated circuit (IC) device from adversely affecting internal signals such as reference voltage signals generated within the IC device. In the following description, for purposes of explanation, specific nomenclature is set forth to provide a thorough understanding of the present invention. In other instances, well-known circuits and devices are shown in block diagram form to avoid obscuring the present invention. Further, the logic levels assigned to various signals in the description below are arbitrary, and thus can be modified (e.g., reversed polarity) as desired. Accordingly, the present invention is not to be construed as limited to specific examples described herein but rather includes within its scope all embodiments defined by the appended claims.

Figure 1:
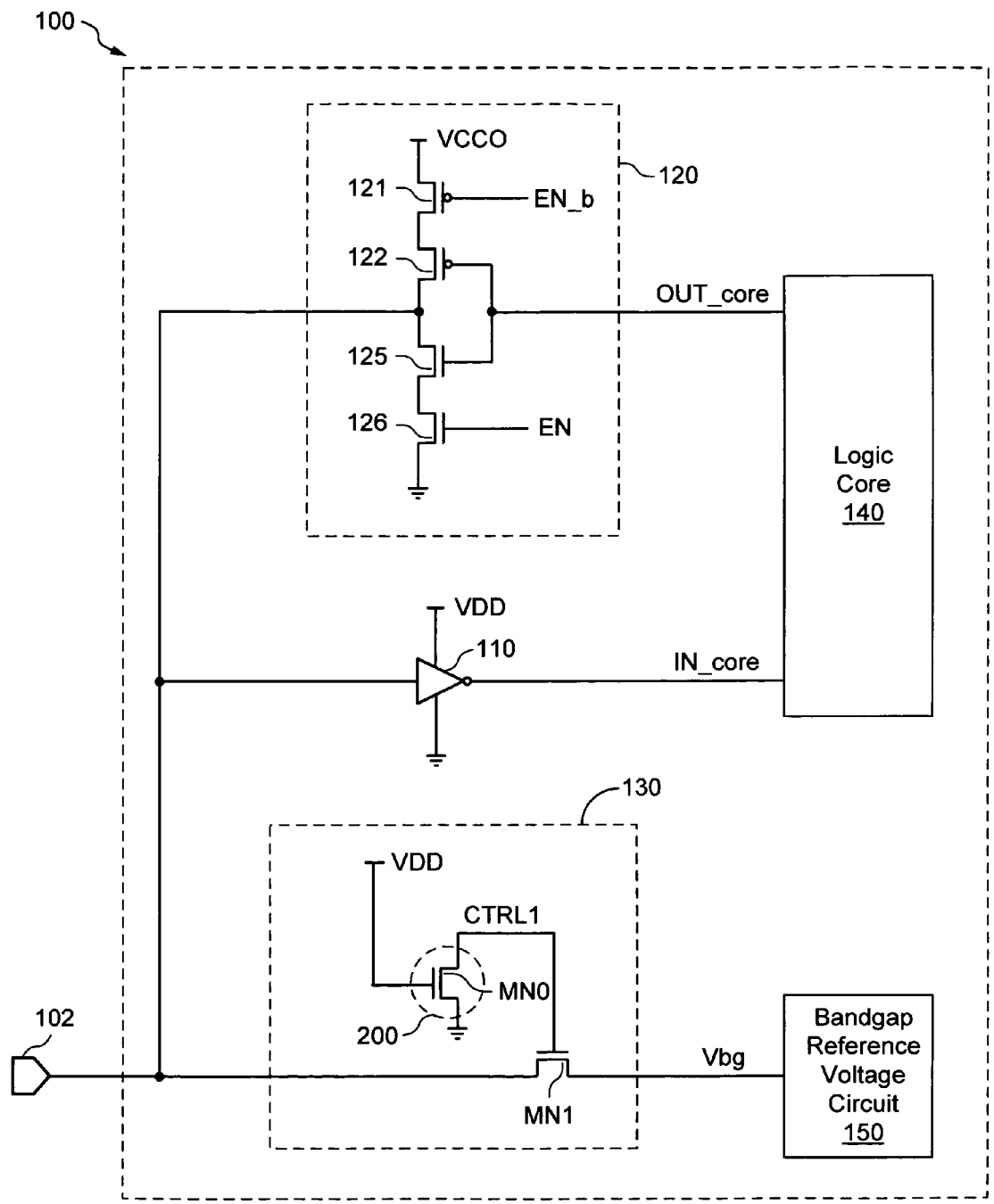
FIG. 1 is a circuit diagram of an IC device having a conventional test-mode circuit coupled between an I/O pad and a bandgap reference voltage circuit.
Figure 4:
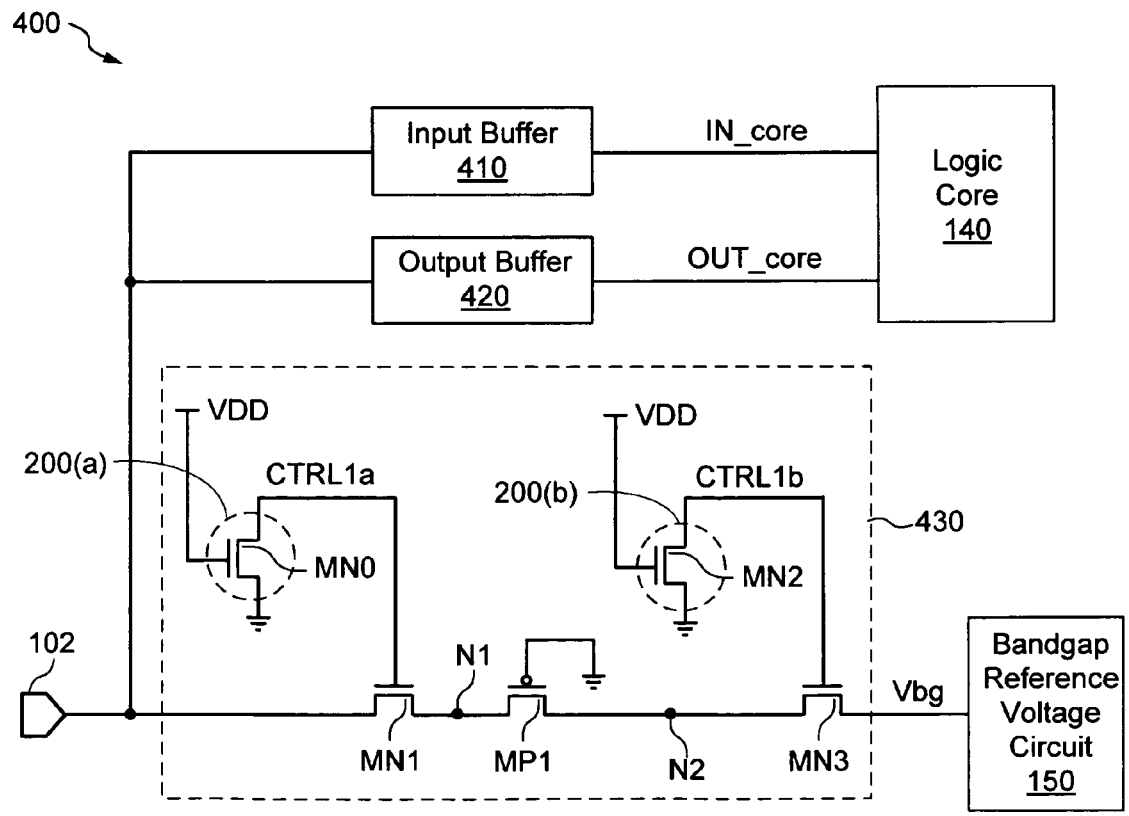
FIG. 4 is a circuit diagram of an IC device including a test-mode circuit configured in accordance with some embodiments of the present invention.
Figure 3:
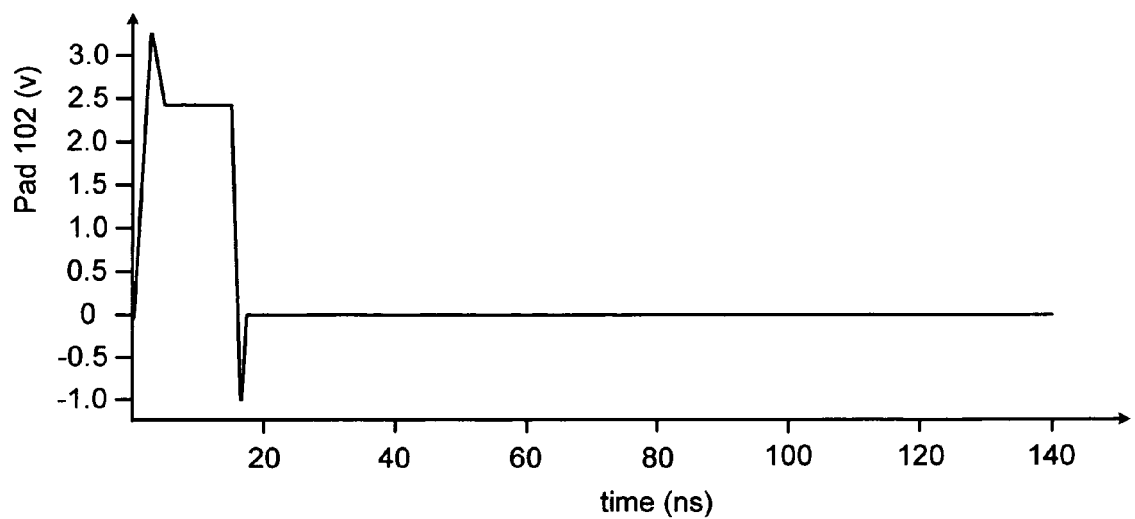
FIG. 3 illustrates pad and bandgap reference voltage waveforms for an exemplary operation of the circuit of FIG. 1.
Figure 3:
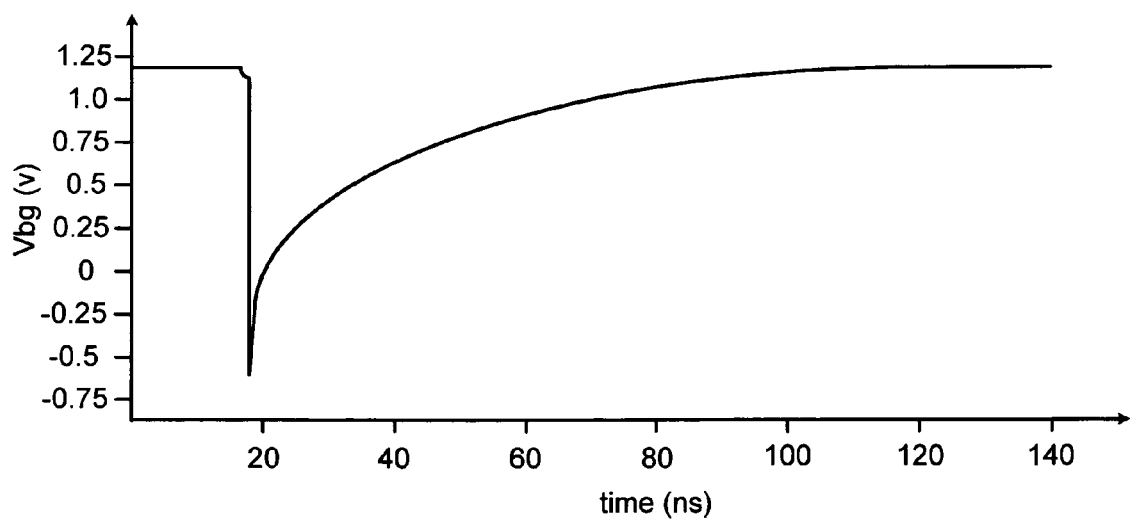

FIG. 4 shows an integrated circuit 400 such as a PLD that includes a pad 102, an input buffer 410, an output buffer 420, logic core 140, bandgap reference voltage circuit 150, and a test-mode circuit 430. For purposes of discussion herein, circuit 400 utilizes a supply voltage VDD of 2.5 volts, and bandgap reference circuit 150 generates a value of Vbg approximately equal to 1.2 volts, although for other embodiments VDD and Vbg may be of other values. For simplicity, only one pad 102, associated buffers 410–420, and test-mode circuit 430 are shown in FIG. 4. For actual embodiments, circuit 400 may include any number of pads 102, associated buffers 410 and 420, and test-mode circuits 430. Logic core 140 may include any suitable circuitry (e.g., configurable logic elements of a PLD). Bandgap reference voltage circuit 150 may utilize any suitable circuitry to generate the bandgap reference voltage Vbg. Input buffer 410 may be any suitable circuit that buffers input signals IN_core provided by pad 102 for logic core 140, and output buffer 420 may be any suitable circuit that buffers output signals OUT_core provided by logic core 140 for pad 102. For one embodiment, input buffer 410 and output buffer 420 may be implemented using input buffer 110 and output buffer 120, respectively, of FIG. 1, although other input and output buffer architectures may be used.

Figure 2:
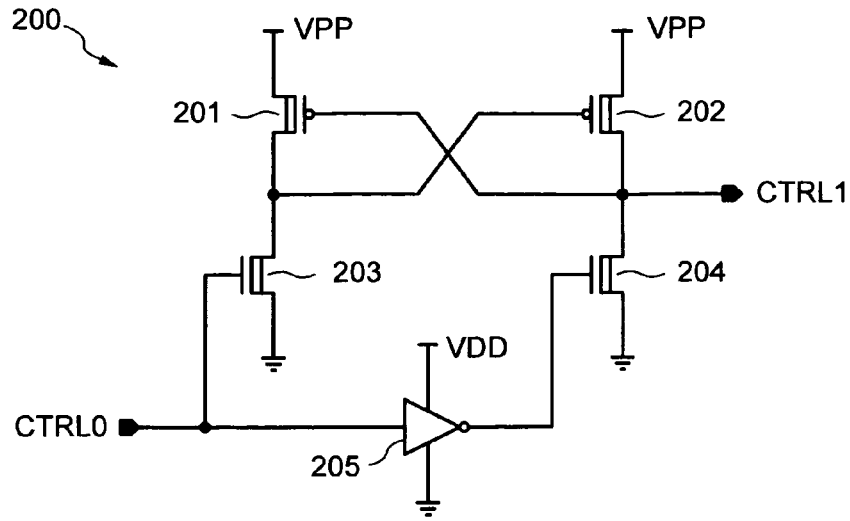
FIG. 2 is a circuit diagram of a well-known level shifter circuit typically employed in the test-mode circuit of FIG. 1.

Test-mode circuit 430 includes NMOS transistors MN0–MN3 and a PMOS transistor MP1. NMOS transistor MN1 is a pass transistor coupled between pad 102 and node N1, and includes a gate to receive a first control signal CTRL1a from transistor MN0. NMOS transistor MN0, which is coupled between ground potential and the gate of transistor MN1, is depicted as having a gate coupled to VDD. Referring also to FIG. 2, for some embodiments, MN0 models a first level shifter 200(a) when first level shifter 200(a) is configured to drive CTRL1a logic low to ground potential. PMOS transistor MP1 is coupled between nodes N1 and N2 of test-mode circuit 430, and has a gate tied to ground potential. NMOS transistor MN3 is a pass transistor coupled between node N2 and bandgap reference voltage circuit 150, and includes a gate to receive a second control signal CTRL1b. NMOS transistor MN2, which is coupled between ground potential and the gate of transistor MN3, is depicted as having a gate coupled to VDD. For some embodiments, MN2 models a second level shifter 200(b) when second level shifter 200(b) is configured to drive corresponding output signal CTRL1b to a logic low state. For another embodiment, transistors MN0 and MN2 may model other suitable level shifters.

Although not shown for simplicity, the substrates of MN0–MN3 are coupled to ground potential, and the substrate of MP1 is coupled to VDD. Further, although not shown for simplicity, circuit 400 may include storage elements (e.g., fuses, latches, registers, memory cells, and the like) to store logic values for control signals CTRL0a and CTRL0b as input signals to level shifters 200(a) and 200(b), respectively. As described below, level shifter 200(a) generates CTRL1a in response to CTRL0a for controlling pass transistor MN1, and level shifter 200(b) generates CTRL1b in response to CTRL0b for controlling pass transistor MN3. For another embodiment, input control signals CTRL0a and CTRL0b may be the same control signal. For yet another embodiment, output control signals CTRL1a and CTRL1b may be generated using the same level shifter, and/or stored in the same storage element. For other embodiments, level shifters 200(a) and 200(b) may be eliminated, and control signals CTRL1a and CTRL1b may be provided to the gates of pass transistors MN1 and MN3, respectively, from corresponding storage elements (not shown for simplicity).

Together, PMOS transistor MP1 and NMOS transistors MN1 and MN3 form an isolation circuit that allows Vbg to be observed via pad 102 during test operations of circuit 400 (e.g., when CTRL1a and CTRL1b are asserted to logic high) and to isolate Vbg from pad 102 during normal operation of circuit 400 (e.g., when CTRL1a and CTRL1b are de-asserted to logic low). As explained below, during normal (e.g., non-test) operations, the isolation circuit formed by MP1, MN1, and MN3 isolates Vbg from undesirable fluctuations caused by switching events at pad 102, power supply noise, and/or ground bounce more effectively than prior art circuit 130.

An illustrative operation of an exemplary embodiment of test-mode circuit 430 is described below with reference to FIGS. 2, 4, and 5. For example, during pre-packaging test operations for circuit 400, storage elements such as fuses and/or memory cells (not shown for simplicity) may be configured to store logic high values for CTRL0a and CTRL0b as input signals to first and second level shifters 200(a) and 200(b), respectively. First level shifter 200(a) translates the logic high value of CTRL0a from VDD to generate CTRL1a having a value of approximately VPP, where VPP>VDD. Second level shifter 200(b) translates the logic high value of CTRL0b from VDD to generate CTRL1b having a value of approximately VPP. The logic high signals CTRL1a and CTRL1b turn on NMOS pass transistors MN1 and MN3, respectively. Because the gate of MN3 is approximately VPP, which is more than one VTn above Vbg, Vbg appears (without a voltage drop) across MN3 at node N2. Because the gate of PMOS transistor MP1 is tied to ground potential, which is more than one VTp below Vbg, Vbg appears (without a voltage drop) across MP1 at node N1. Because the gate of MN1 is approximately VPP, which is more than VTn above Vbg, Vbg appears (without a voltage drop) across MN1 and may be observed (e.g., by a test engineer) via pad 102.

After testing is complete and prior to delivery of circuit 400 to a customer, the storage elements associated with level shifters 200(a) and 200(b) may be programmed to store logic low values for CTRL0a and CRTL0b, respectively. Thereafter, during normal operation of circuit 400 (e.g., by a customer), the logic low states of CTRL0a and CRTL0b cause corresponding level shifters 200(a) and 200(b) to drive CTRL1a and CRTL1b, respectively, to logic low states (e.g., ground potential). The logic low state of CTRL1a turns off MN1, and the logic low state of CTRL1b turns off MN3. Transistor MN3 prevents Vbg from appearing at node N2, and transistor MN1 prevents the pad voltage from appearing at node N2.

Further, because the gate of MN1 is pulled to ground potential via MN0, the voltage at pad 102 must drop to below −VTn to turn on MN1. However, if the pad voltage undershoots to approximately −VTn, which may turn on MN1, MN1 will pull down node N1 to approximately −VTn. Because the gate of MP1 is at ground potential and the source of MP1 is at −VTn or less, MP1 turns off and isolates node N2 from the negative voltage at node N1. Thus, because transistor MP1 turns on when voltage undershoot conditions at pad 102 cause transistor MN1 to turn on, transistors MP1 and MN1 isolate pad 102 from node N2 even if the pad voltage drops below −VTn, thereby rendering Vbg less susceptible to undesirable fluctuations caused by switching events at pad 102 than, for example, prior art circuit 130 of FIG. 1. Otherwise, if the voltage at pad 102 overshoots, the increasing voltage at pad 102 turns off MN1, thereby isolating Vbg from pad 102. In this manner, test-mode circuit 430 allows the value of Vbg to remain substantially constant, irrespective of voltage undershoots and/or overshoots at pad 102.

Further, note that because the ground potential at the gate of MP1 tracks the ground potential at the source of MN0, fluctuations in the ground signal provided to MN1 via MN0 are tracked by the ground signal provided to the gate of MP1, thereby allowing test-mode circuit 430 to minimize undesirable fluctuations in Vbg resulting from ground bounce. More specifically, PMOS transistor MP1 compensates for ground bounce caused by switching events at pad 102 by turning on when transistor MN1 is undesirably turned on. Thus, for actual embodiments, it may be desirable for the connections between ground potential and transistors MN0, MN2, and MP1 to be as close together as possible, for example, to minimize any phase differences between ground bounce at the sources of MN0 and MN2 and the gate of MP1.

Figure 5:
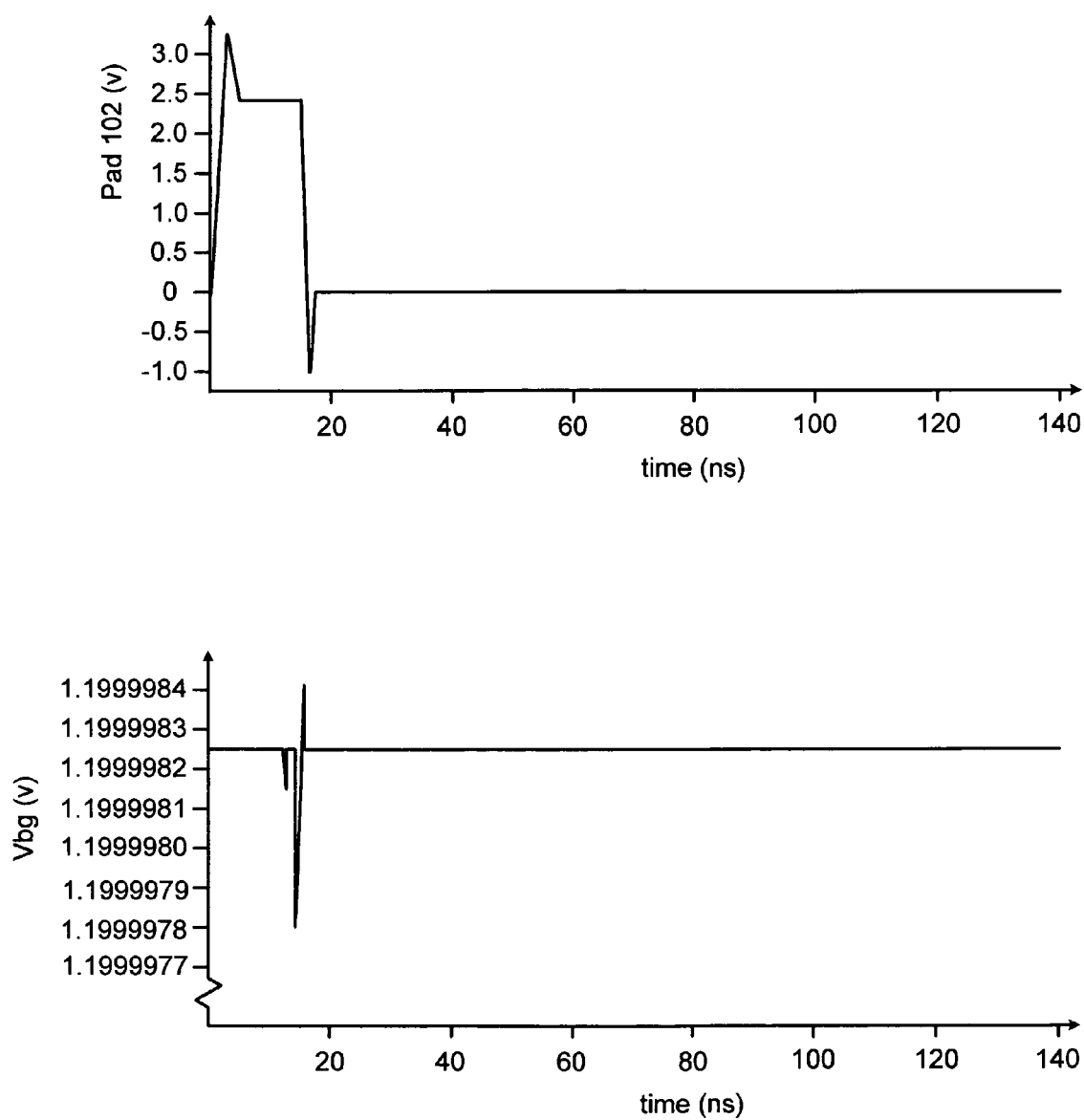
FIG. 5 illustrates pad and bandgap reference voltage waveforms for an exemplary operation of the circuit of FIG. 4.

FIG. 5 depicts an illustrative relationship between the pad voltage and Vbg simulated for an exemplary embodiment of circuit 400. As shown in FIG. 5, when protected by test-mode circuit 430, the value of Vbg toggles very slightly from its intended value of 1.1999925 volts in response to changes in the pad voltage. More specifically, Vbg reaches a maximum value of approximately 1.19999884 volts and a minimum value of approximately 1.1999978 volts in response to a high-to-low signal transition at pad 102. In contrast, the value of Vbg toggles significantly in response to changes in the pad voltage when protected by prior art test-mode circuit 130, reaching a minimum value of less than −0.5 volts and thereafter gradually increasing towards its intended value of approximately 1.2 volts. In this manner, embodiments of the present invention more effectively isolate Vbg from pad 102 than prior art test-mode circuits such as test-mode circuit 130 of FIG. 1.

Figure 6:
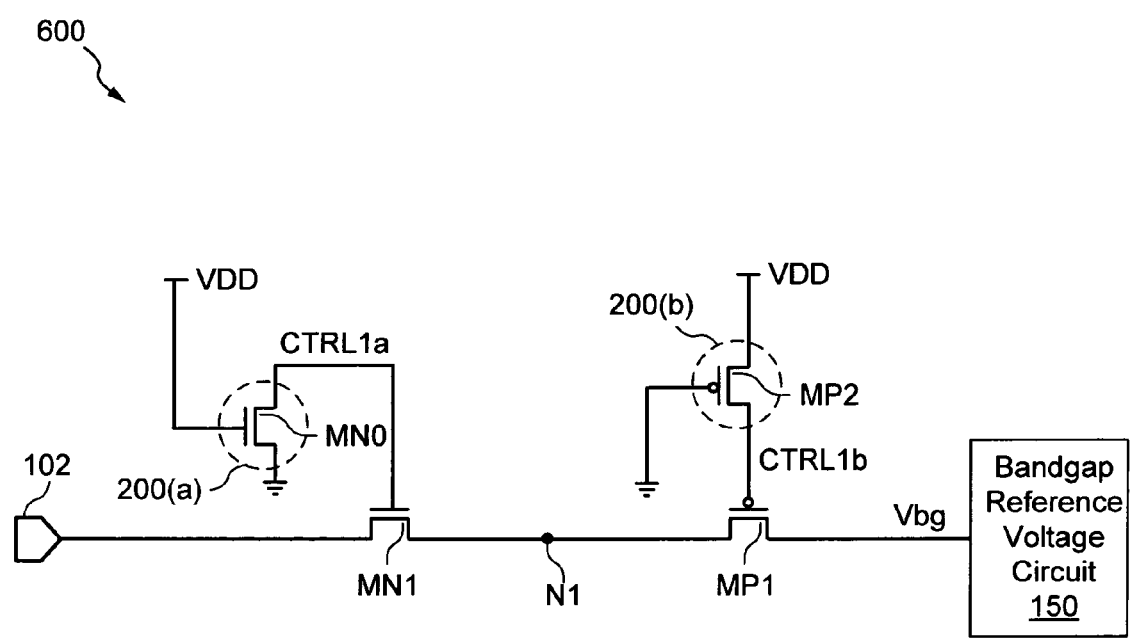
FIG. 6 is a circuit diagram of a test-mode circuit in accordance with other embodiments of the present invention.

FIG. 6 shows a test-mode circuit 600 in accordance with other embodiments of the present invention. Circuit 600 includes level shifter 200(a) modeled by NMOS transistor MN0, NMOS transistor MN1, level shifter 200(b) modeled by PMOS transistor MP2, and PMOS transistor MP1. The architecture of circuit 600 is similar to circuit 430 of FIG. 4, except the gate of MP1 receives CTRL1b provided by level shifter 200(b). During test operations of circuit 400, CTRL1a is asserted to logic high and CTRL1b is asserted to logic low. The logic high state of CTRL1a turns on transistor MN1, and the logic low state of CTRL1b turns on transistor MP1, thereby allowing Vbg to be observed via pad 102. During normal operation, CTRL1a is de-asserted to logic low and CTRL1b is de-asserted to logic high. The logic low state of CTRL1a turns off transistor MN1, and the logic high state of CTRL1b turns off transistor MP1, thereby isolating Vbg and pad 102 from each other in a manner similar to that described above with respect to FIG. 4. However, unlike circuit 430 of FIG. 4, circuit 600 of FIG. 6 may not be able to isolate Vbg and pad 102 from each other if the voltage level of VDD sufficiently dips at the same time as undesirable positive spikes in ground potential to turn on MP1, which undesirably couples Vbg and pad 102 together.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention. For example, although described above in the context of isolating a bandgap reference voltage from an IC device's I/O pad, embodiments of the present invention are equally applicable for isolating other critical device signals from I/O pads during normal operation of the IC device.

What is claimed is:

1. A semiconductor device, comprising:
    a reference circuit for generating a reference signal;
    a pad configured to receive input signals into the device and to provide output signals from the device; and
    a test-mode circuit coupled between the reference circuit and the pad, the test-mode circuit comprising:
        a first NMOS transistor coupled between the pad and a first node, and having a gate to receive a control signal;
        a PMOS transistor coupled between the first node and a second node, and having a gate tied to ground potential; and
        a second NMOS transistor coupled between the second node and the reference circuit, and having a gate to receive the control signal.

2. The device of claim 1, further comprising:
    a storage element for storing the control signal.

3. The device of claim 2, wherein the storage element comprises a fuse.

4. The device of claim 1, further comprising:
    a level shifter having an input to receive an input control signal and having an output to generate the control signal in response to the input control signal.

5. The device of claim 4, further comprising:
    a storage element for storing the input control signal.

6. The device of claim 1, wherein the reference signal comprises a bandgap reference voltage.

7. The device of claim 1, wherein assertion of the control signal causes the test-mode circuit to couple the pad and the reference circuit together, and de-assertion of the control signal causes the test-mode circuit to isolate the pad and the reference circuit from each other.

8. The device of claim 1, wherein during normal operation the PMOS transistor is initially in a conductive state and the control signal causes the first NMOS transistor to turn off to isolate the reference signal from the pad, and wherein the PMOS transistor is configured to turn off during voltage undershoot conditions at the pad that cause the first NMOS transistor to turn on.

9. The device of claim 1, further comprising:
    a first level shifter having an input to receive an input the control signal and having an output coupled to the gate of the first NMOS transistor; and
    a second level shifter having an input to receive the input control signal and having an output coupled to the gate of the second NMOS transistor.

10. A semiconductor device, comprising:
    a reference circuit for generating a reference signal;
    a pad configured to receive input signals into the device and to provide output signals from the device; and
    a test-mode circuit coupled between the reference circuit and the pad, the test-mode circuit comprising:
        a first NMOS transistor coupled between the pad and a first node, and having a gate to receive a first control signal; and
        a first PMOS transistor coupled between the first node and the reference circuit, and having a gate to receive a second control signal having a complementary value to the first control signal.

11. The device of claim 10, wherein the reference signal comprises a bandgap reference voltage.

12. The device of claim 10, further comprising:
a storage element for storing the first control signal.

13. The device of claim 12, wherein the storage element comprises a fuse.

14. The device of claim 10, further comprising:
a level shifter having an input to receive an input control signal and having an output to generate the first control signal in response to the input control signal.

15. The device of claim 14, further comprising:
a storage element for storing the input control signal.

16. The device of claim 10, wherein assertion of the first control signal causes the test-mode circuit to couple the pad and the reference signal together, and de-assertion of the first control signal causes the test-mode circuit to isolate the pad and the reference signal from each other.

17. The device of claim 10, further comprising:
a first level shifter having an input to receive a first input control signal and having an output coupled to the gate of the first NMOS transistor; and
a second level shifter having an input to receive a second input control signal and having an output coupled to the gate of the first PMOS transistor.

* * * * *